(12) United States Patent
Tucker et al.

(10) Patent No.: US 9,112,467 B1
(45) Date of Patent: Aug. 18, 2015

(54) ENERGY-EFFICIENT CONSUMER DEVICE AUDIO POWER OUTPUT STAGE

(71) Applicant: Cirrus Logic, Inc., Austin, TX (US)

(72) Inventors: John Christopher Tucker, Austin, TX (US); Daniel John Allen, Austin, TX (US); John L. Melanson, Austin, TX (US); Ammisetti Prasad, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 480 days.

(21) Appl. No.: 13/652,939

(22) Filed: Oct. 16, 2012

Related U.S. Application Data

(63) Continuation of application No. 11/610,496, filed on Dec. 13, 2006, now Pat. No. 8,311,243.

(51) Int. Cl.
*H03F 99/00* (2009.01)
*H03G 3/20* (2006.01)
*H02M 3/07* (2006.01)
*H03F 1/02* (2006.01)

(52) U.S. Cl.
CPC . *H03G 3/20* (2013.01); *H02M 3/07* (2013.01); *H03F 1/025* (2013.01); *H03F 1/0227* (2013.01); *H03F 2200/03* (2013.01); *H03F 2200/211* (2013.01); *H03F 2200/507* (2013.01)

(58) Field of Classification Search
CPC ........ H02M 3/07; H03F 1/0227; H03F 1/025; H03F 2200/03; H03F 2200/211; H03F 2200/507
USPC ............. 381/120, 121; 330/397, 10, 146, 202
See application file for complete search history.

(56) References Cited

U.S. PATENT DOCUMENTS

| 4,409,559 A | 10/1983 | Amada et al. |
| 4,873,493 A | 10/1989 | Fuijiwara |

(Continued)

FOREIGN PATENT DOCUMENTS

| DE | 19858963 A1 | 7/2000 |
| DE | 10140285 A1 | 2/2003 |

(Continued)

OTHER PUBLICATIONS

Quilter, Patrick "Amplifier Anatomy", QSC Audio Products, published in Sound & Video Contractor, Feb. 20, 1993, 13 pages (pp. 1-13 in pdf).

(Continued)

*Primary Examiner* — Paul S Kim
(74) *Attorney, Agent, or Firm* — Mitch Harris, Atty at Law, LLC; Andrew M. Harris

(57) ABSTRACT

An energy-efficient consumer device audio power output stage with gain control provides improved battery life and reduced power dissipation without clipping the audio output signal. A power supply having a selectable operating mode supplies the power supply rails to the power amplified output stage. The operating mode is controlled in conformity with an input audio signal level, which may be determined from a volume control setting of the device and/or from a signal level detector that determines the amplitude of the signal being amplified. The gain applied to the audio input signal is reduced for a predetermined time period when a higher output voltage of the power supply is selected, to avoid clipping the audio output signal.

20 Claims, 4 Drawing Sheets

(56) References Cited

U.S. PATENT DOCUMENTS

| | | | |
|---|---|---|---|
| 5,289,137 A | 2/1994 | Nodar et al. | |
| 5,442,317 A * | 8/1995 | Stengel | 330/10 |
| 5,532,916 A | 7/1996 | Tamagawa | |
| 5,760,637 A | 6/1998 | Wong et al. | |
| 6,084,789 A | 7/2000 | Van Lieshout | |
| 6,104,248 A | 8/2000 | Carver | |
| 6,304,138 B1 | 10/2001 | Johnson | |
| 6,329,800 B1 | 12/2001 | May | |
| 6,586,992 B1 | 7/2003 | Strakovsky | |
| 6,636,103 B2 | 10/2003 | Wurcer et al. | |
| 7,031,457 B2 | 4/2006 | Melsa | |
| 7,061,327 B2 | 6/2006 | Doy | |
| 7,183,857 B2 | 2/2007 | Doy et al. | |
| 7,298,214 B2 | 11/2007 | Lee et al. | |

FOREIGN PATENT DOCUMENTS

| | | | |
|---|---|---|---|
| EP | 0279694 | A2 | 8/1988 |
| EP | 1317105 | A1 | 6/2003 |
| GB | 2360410 | A | 9/2001 |
| WO | WO 94/11799 | A1 | 5/1994 |
| WO | WO 2006031304 | A2 | 3/2006 |

OTHER PUBLICATIONS

Office Action in U.S. Appl. No. 11/610,496 mailed Sep. 15, 2010, 23 pages (pp. 1-23 in pdf).

Final Office Action in U.S. Appl. No. 11/610,496 mailed Apr. 27, 2011, 21 pages (pp. 1-21 in pdf).

Office Action in U.S. Appl. No. 11/611,069 mailed Oct. 5, 2010 22 pages (pp. 1-22 in pdf).

Quilter, Patrick "Amplifier Anatomy", QSC Audio Products, published in Sound & Video Contractor Feb. 20, 1993.

Office Action in U.S. Appl. No. 11/610,496 mailed Sep. 15, 2010.

Final Office Action in U.S. Appl. No. 11/610,496 mailed Apr. 27, 2011.

Office Action in U.S. Appl. No. 11/611,069 mailed Oct. 5, 2010.

* cited by examiner

ENERGY-EFFICIENT CONSUMER DEVICE AUDIO POWER OUTPUT STAGE

CROSS-REFERENCE TO RELATED APPLICATIONS

The present U.S. Patent Application is a Continuation of U.S. patent application Ser. No. 11/610,496, filed on Dec. 13, 2006 and published as U.S. Published Patent Application 20080044041 on Feb. 21, 2008, which claims priority to U.S. provisional application Ser. No. 60/823,036, filed Aug. 21, 2006 under 35 U.S.C. §119(e).

BACKGROUND OF THE INVENTION

1. Field of the Invention

The present invention relates generally to consumer device audio power output stages, and more specifically, to a audio power stage using a selectable-voltage charge-pump to conserve energy.

2. Background of the Invention

In battery-operated consumer audio devices, the power amplifier output, which is generally utilized to drive a pair of headphones or a speaker can be the primary consumer of battery power. In devices having a linear power amplifier for the output stage, power is wasted during low signal level outputs, since the voltage drop across the active output transistor plus the output voltage will be equal to the constant power supply rail voltage. Even though the current in the transducer is reduced at low signal amplitudes, more power is still wasted by dissipation in the output transistors than is delivered to the load. Battery power is typically only reduced in linear amplifier circuits by lowering the power supply voltage, which limits the available output power and also may not be possible in some applications in which the power amplifier output also serves as a line output signal that must provide a specified signal level at full signal level, for example +5 dBm (15 dB over −10 dBm) as referenced into a 600 ohm load, which requires a signal swing of $3V_{p\text{-}p}$.

Therefore, it would be desirable to provide a power amplifier circuit for a consumer audio device that has improved efficiency and reduced power dissipation, while maintaining a specified full-signal output level capability.

SUMMARY OF THE INVENTION

The above stated objectives of providing improved efficiency and reduced power dissipation is achieved in a linear power amplifier circuit for a consumer audio device and its method of operation.

The power amplifier circuit includes a power supply with a selectable operating mode, so that in a second mode of operation, the power supply produces a power supply voltage that is a rational fraction of the power supply voltage in a first operating mode. A control signal that sets the operating mode has a state determined from the magnitude of an audio input signal that is amplified by the power amplifier circuit to produce an audio output signal. A gain control circuit controls the gain applied to the audio input signal for a predetermined time period after the state of the control signal changes to select the second operating mode, so that clipping of the audio output signal is prevented.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses an audio power amplifier stage for a consumer audio device, and a charge-pump power supply for supplying the power supply rails of at least the final power amplifier stage. The voltage of the power supply provided to the final amplifier stage is selectable and is set in conformity with either an expected or actual signal level of the audio signal being amplified, so that at signal amplitudes that do not require the maximum power supply voltage, the power supply voltage is reduced to conserve power. For example, when amplifying a signal having typical maximum amplitude −6 dB below occasional peaks referenced at 0 dB, the power supply voltage of the final amplifier stage can be reduced by a factor of two during intervals between the above-described peaks, without causing clipping. The result is a potential reduction in power consumption by a factor of four and a reduction in power dissipation by at least that factor over that of an amplifier that does not have a selectable power supply. The charge pump power supply provides a simple selectable-voltage power supply implementation that reduces the power supply voltage by a rational factor, by employing a capacitive divider that divides the input supply voltage and then applies at least one of the divided voltages to the output of the power supply to provide the reduced voltage.

Figure 1:
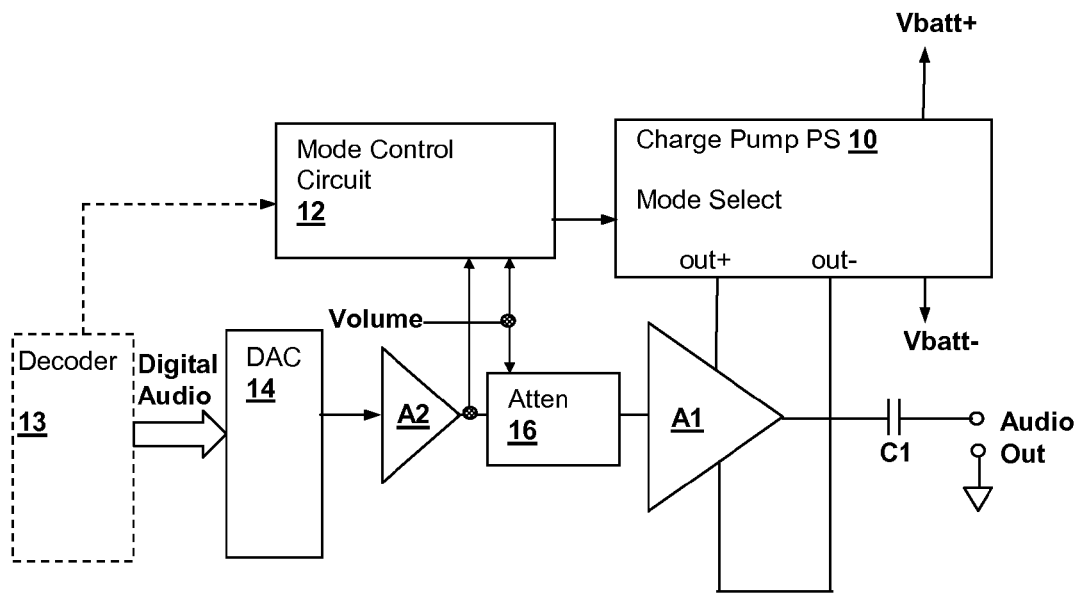
FIG. 1 is a schematic diagram depicting an audio output stage of a consumer audio device in accordance with an embodiment of the invention.

Referring now to FIG. 1, a consumer audio device audio output stage is depicted in accordance with an embodiment of the present invention. A digital-to-analog converter (DAC) 14 supplies an analog signal to a first amplifier stage A2 that is operated from a fixed voltage power supply. The input to DAC 14 may optionally be provided by a decoder 13, that decodes a file or stream data source such as an MP3 encoded data stream. The signal at the output of first amplifier stage A2 is provided to an attenuator 16 that receives a volume control signal and attenuates the signal accordingly. Attenuator 16 may be a digital potentiometer having control provided from a microcontroller or other digital control circuit responsive to a user interface, volume knob encoder or program command, or attenuator 16 may be an analog potentiometer that provides the volume control signal as an output indication from a secondary deck (separate potentiometer circuit coupled to the common shaft or other mechanism) for use in the power supply control algorithms described below. While an attenuator 16 is shown as the volume control mechanism, it is understood that an equivalent volume control may be provided by a programmable resistor in the feedback of amplifier A2 or another amplifier stage in the signal path. A final power amplifier stage A2 amplifies the signal received from attenuator 16 and provides an audio output signal, which may operate a speaker, headphone transducer, and/or a line level signal output. A capacitor C1 may be utilized to couple the output signal to the transducer or line level output, particularly if amplifier A1 is operated from a unipolar power supply having a quiescent voltage substantially differing from ground.

The volume control signal is also supplied to a mode control circuit 12 for controlling the output power supply voltage supplied to the power supply rails of power amplifier A1 in conformity with an expected range of signal levels at the output of power amplifier A1, so that power amplifier A1 will not clip for high (peak) signal levels, but will have a reduced power supply voltage when high (peak) signal levels are not present. Alternatively, or in combination, the output of amplifier A2 is also provided to mode control circuit 12 so that actual signal levels can be measured by mode control circuit 12 and the power supply voltage of power amplifier A1 adjusted in conformity with the actual signal level that will be reproduced at the output power amplifier A1. In the depicted embodiment, since the volume control is applied after the signal level measurement taken from the output of amplifier A2, the volume information is needed even if the signal level is detected by mode control circuit 12, since mode control circuit must also receive information relating to the amount of gain/attenuation that will be applied to the signal prior to amplification by power amplifier A1. Also, an output of decoder 13, if present, may provide an advance notification to mode control circuit 12 that a peak in signal amplitude will be arriving at DAC 14 and thus provide an early indication that the operating mode needs to be changed if the lower voltage/power operating mode of charge pump power supply 10 is selected.

Charge pump power supply 10 provides the power supply rail inputs of amplifier A1 and receives a power supply input, generally from a battery or other power supply, depicted as battery terminal connections Vbatt+ and Vbatt−. Mode control circuit 12 supplies a Mode Select signal to charge pump power supply 10, that selects an operating mode of charge pump power supply 10. Charge pump power supply 10 provides output power supply rail connections out+ and out− that will have a "full" (maximum) voltage in a first operating mode and a voltage that is a rational fraction of the full voltage in a second operating mode, as selected by mode control circuit, when the audio signal level is low enough or expected to be low enough that clipping will not occur at the output of power amplifier A1.

Figure 2:
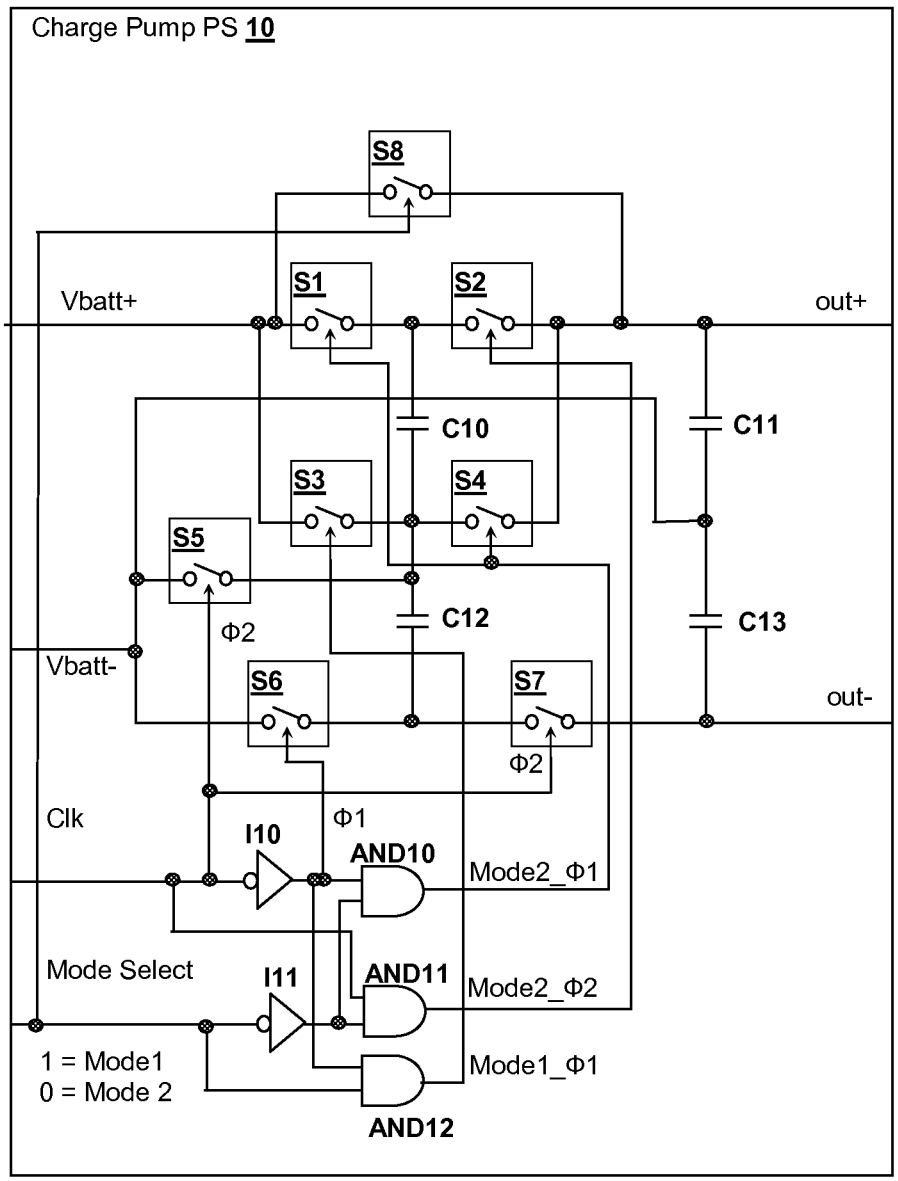
FIG. 2 is a schematic diagram depicting a charge-pump power supply 10 of FIG. 1 and in accordance with an embodiment of the invention.
Figure 3A:
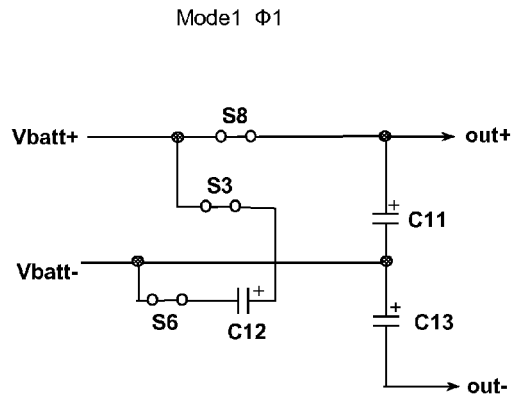
FIGS. 3A-3D are schematic diagrams depicting the individual charge-pump clock phases for each operating mode of the charge-pump power supply circuit of FIG. 2.
Figure 3B:
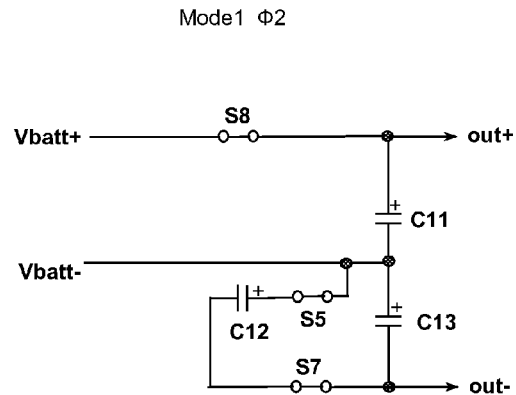

Referring now to FIG. 2 and additionally with reference to FIGS. 3A-3D, details of charge pump power supply 10 are shown. When the first operating mode (Mode 1) is selected, the Mode Select signal is in the logical high ("1") state, and switch S8 is closed, to apply the Vbatt+ voltage directly to the out+ terminal. FIG. 3A and FIG. 3B show the circuit connection arrangement for Mode 1 in the first and second clock phases, respectively, omitting open switches and inactive circuit components. Switches S1, S2 and S4 are open and not activated in the first operating mode, as logical AND gates AND10 and AND11 disable the control signals to switches S1, S2 and S4, as the inverted Mode Select signal provided by inverter 110 is in a logical low ("0") state. For a single-ended (unipolar) power supply, capacitors C12-C13, switches S3, S6 and switch S7 are omitted. As illustrated in FIGS. 3A-3B, in Mode 1, the positive power supply voltage at terminal out+ is supplied directly from the positive input terminal Vbatt+.

To produce the negative output supply voltage in mode 1, the input voltage provided between input terminals Vbatt+ and Vbatt− is inverted by a voltage inverter. In phase one ($\phi 1$) of mode 1, switch S3 is closed and switch S6 is closed, which charges capacitor C12 by connection across input terminals Vbatt+ and Vbatt−, as illustrated in FIG. 3A. While FIGS. 3A-3D show polarized capacitors C10-C13 for purposes of clarity, it is understood that polarized capacitors are not required and that non-polarized capacitors can be utilized for capacitors C10-C13. In phase two ($\phi 2$) of mode 1, switch S3 and switch S6 are opened and switch S5 and switch S7 are closed, which reverses the terminal of capacitor C12 applied to the Vbatt− input terminal. Switch S7 applies the terminal of capacitor C12 that was applied to the Vbatt− input terminal in phase one, to the negative output terminal out−, as further illustrated by FIG. 3B. The switching action described above provides a negative voltage at the out− terminal with respect to the Vbatt− terminal that is substantially equal to the magnitude of the voltage between the out+ terminal and the Vbatt− terminal, which acts as the reference midpoint voltage (ground) at the junction between output capacitors C11 and C13.

In the second operating mode (Mode 2), which is active when the Mode Select signal is in the logical low ("0") state, switch S8 is opened. In phase one ($\phi 1$) of Mode 2, switches S1 and S4 are closed, which apply capacitor C10 in series with output capacitor C11 across the Vbatt+ and Vbatt− terminals, as further illustrated in FIG. 3C. In phase two ($\phi 2$) of Mode 2, switches S1 and S4 are opened and switches S2 and S5 are closed, which connect capacitor C10 in parallel with capacitor C11 as further illustrated in FIG. 3D. Since the second phase of mode 2 equalizes the voltage on capacitors C10 and C11, the stable operating point of the circuit is such that the input voltage between the Vbatt+ and Vbatt− terminals will be split equally during the charging phase, irrespective of the relative capacitance of C10 and C11. Thus the voltage at the out+ output terminal in Mode 2 will be half of the voltage across the Vbatt+ and Vbatt− terminals. Other ratios can be constructed by switching more capacitors in series with capacitors C10 and C11 during phase one, and connecting them all in parallel during phase two. For example, a voltage of one third of the input battery voltage may be produced by using three capacitors connected alternatively in series across the battery terminals and parallel between the out+ terminal and the Vbatt− terminal.

Figure 3C:
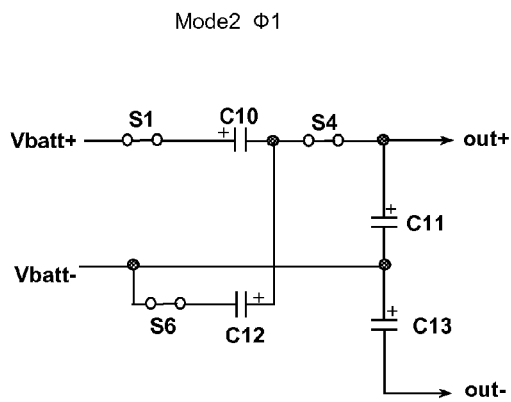
Figure 3D:
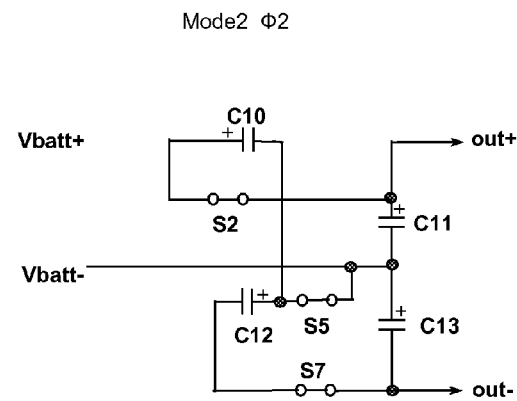

The negative supply in the second operating mode (Mode 2) is provided in a manner similar to that of the first operating mode and the connections of capacitor C12 are shown in FIG. 3B and FIG. 3D, as being the same. However, as illustrated in FIG. 3C, since switch S8 is open in the second operating mode, during phase one of Mode 2, capacitor C12 is charged from the out+ terminal rather than the Vbatt+ terminal as was shown in FIG. 3A for Mode 1. Switch S4 performs the operation of connecting capacitor C12 to the out+ terminal, as illustrated in FIG. 3C, along with the above-described operation of applying capacitor C10 in series with capacitor C11 in phase one for the positive power supply and therefore the relative phases between the voltage inverter supplying the out− voltage and the circuit supplying the out+ voltage must be maintained in the depicted configuration. Otherwise, eight switches may be utilized and the common connection between capacitor C10 and C12 broken. The additional switch would be provided between capacitor C12 and the out+ terminal, and would be active in Mode 2, phase 1. It is also possible to further reduce the number of switches from seven to six, by removing switch S3 and controlling switch S4 with the unqualified ($\phi 1$) signal. However, the inclusion of switch S3 reduces the impedance of the power supply path in the first operating mode, which is the highest voltage/current operating mode. Therefore, it is generally advantageous to include switch S3 in the circuit.

Figure 4:
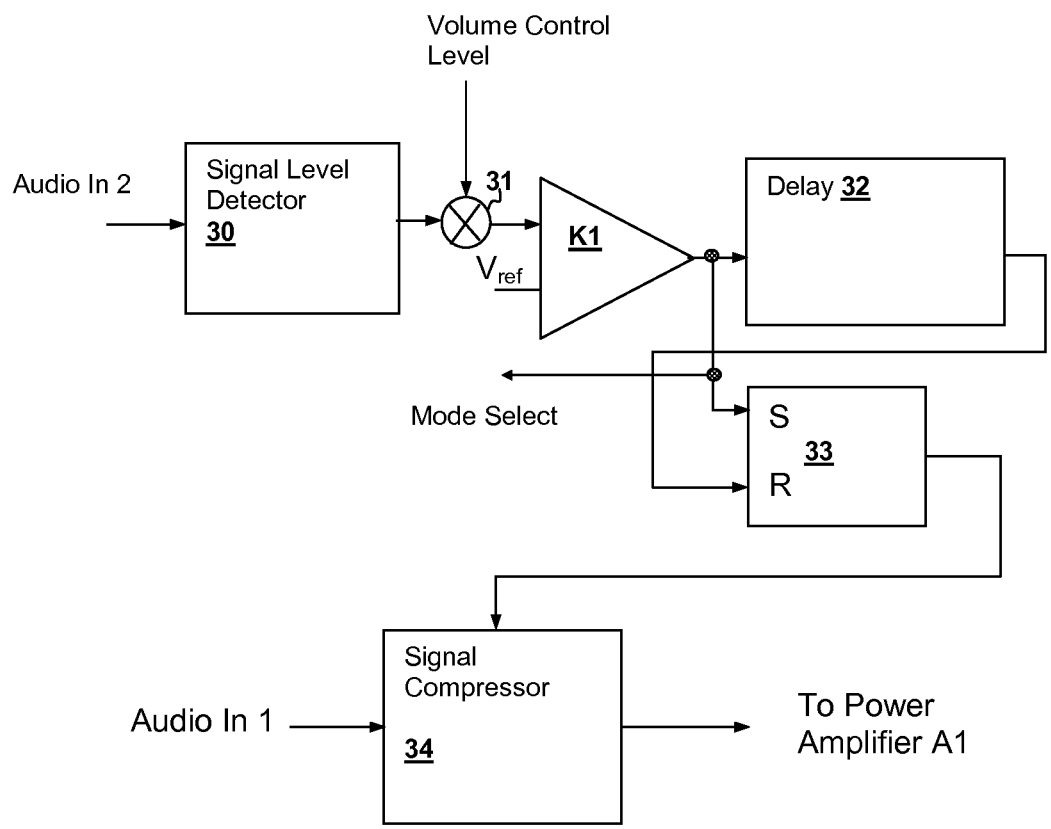
FIG. 4 is a schematic diagram depicting an amplifier control circuit in accordance with an embodiment of the invention.

Referring now to FIG. 4, details of an amplifier control circuit that can be utilized to implement mode control circuit 12 of FIG. 1 is shown. A signal level detector 30, which may be an analog peak detection circuit or the output of a digital circuit that indicates the magnitude of the analog signal at some point in the audio signal path, is optionally combined with downstream volume control information, using a multiplier 31. (If the volume control and signal information are both logarithmic, multiplier 31 is replaced with an adder). A comparator K1 (or equivalent digital domain comparison), determines whether or not the signal level exceeds a threshold $V_{ref}$ and if the threshold is exceeded, then the mode control select signal is set to a high logic level to enable operating mode 1 of the charge pump, providing a higher power supply to power amplifier A1. Suitable time constants can be provided for signal level detector 30 and hysteresis provided within comparator so that mode 2 is not selected unless the peak level of signal has fallen below the threshold for a predetermined time period and/or voltage hysteresis guard band, to prevent excessive changing of the power supply voltage control.

As an alternative, signal level detector 30 can be omitted, and the volume control level can be directly compared to a threshold value, to determine the power supply operating mode and thereby the power amplifier supply rail operating voltage. Since the volume control level is a predictor of the expected peak levels that will need to be reproduced by power amplifier A1, such control will be sufficient in some applications, in particular, applications in which the maximum signal (peak) level is known a priori, such as when the audio signal is supplied from a digital-to-analog converter integrated within the system.

An optional circuit that is responsive to voltage peaks when the power supply circuit is in operating mode 2, is provided by a set-reset latch 33, a delay 32, and a signal compressor 34. When the mode control signal transitions from a logical low level (Mode 2) to a logical high level (Mode 1), set-reset latch 33 is set, and remains set until a predetermined time period of delay 32 has expired. The output of set-reset latch 33 is a pulse that activates signal compressor 34 for the predetermined time, which is generally the time required for the power supply rails of power amplifier A1 to stabilize at the higher power supply rail values of operating mode 1. Signal compressor 34 is inserted in the audio signal path upstream of power amplifier A1, and reduces the signal level to avoid clipping until the power supply rails provided to amplifier A1 are known to be sufficient to support the required output voltage swing without clipping.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An audio amplifier circuit for providing an output signal to an audio transducer, the audio amplifier circuit comprising:
    a power amplifier having an audio input for receiving an audio input signal, an audio output for providing the output signal, and a pair of power supply rail connections;
    a power supply for providing a power supply voltage across the pair of power supply rail connections of the power amplifier, wherein the power supply has a select input for selecting an operating mode of the power supply, wherein in a first operating mode, the power supply voltage is equal to a first voltage, and wherein in a second operating mode the power supply voltage is substantially equal to a rational fraction of the first voltage, whereby power consumption of the power amplifier is reduced when a magnitude of the audio input signal is reduced;
    a control circuit for controlling the select input of the power supply in conformity with an indication of the magnitude, so that the control circuit selects the first operating mode when the indication of magnitude indicates that clipping may occur in the output signal; and
    a gain control circuit for controlling a magnitude of the audio input signal in conformity with the indication of the magnitude for a predetermined period after the control circuit selects the first operating mode of the power supply.

2. The audio amplifier circuit of claim 1, wherein in the second operating mode the power supply voltage is substantially equal to half of the first voltage.

3. The audio amplifier of claim 1, wherein the pump power supply has a unipolar power input having a ground terminal and an input voltage terminal, and wherein the power supply voltage is a bipolar output substantially symmetric about a voltage of the ground terminal.

4. The audio amplifier circuit of claim 1, wherein the power supply is a charge pump power supply comprising a plurality of capacitors and a switching circuit for switching the capacitors alternatively from a series to a parallel combination, and wherein in response to the select input, a pattern of switching of the switching circuit is altered, whereby a rational relationship between the power supply voltage in the first operating mode and the power supply voltage in second operating mode is provided.

5. The audio amplifier circuit of claim 4, wherein the charge pump power supply includes a switched-capacitor voltage divider that uses a series-coupling of capacitors in a first switching phase of the second operating mode to produce the rational fraction of the first voltage and couples at least one of the capacitors to at least one of the power supply rail connections in a second switching phase of the second operating mode to apply the rational fraction of the first voltage to the at least one power supply rail connection.

6. The audio amplifier circuit of claim 1, further comprising a first amplifier stage circuit having an output coupled to the audio input of the power amplifier, wherein the first amplifier stage has a pair of first stage power supply rail connections connected to a fixed voltage power supply, wherein a fixed voltage of the fixed voltage power supply does not change substantially with selection of the operating mode of the power supply.

7. The audio amplifier circuit of claim 1, further comprising a control circuit for selecting the operating mode in conformity with a volume setting of the audio amplifier circuit.

8. The audio amplifier circuit of claim 7, wherein the audio amplifier circuit further comprises a potentiometer coupled to the audio input for controlling a magnitude of the output signal, and wherein the control circuit selects the magnitude in conformity with a control level of the potentiometer.

9. The audio amplifier of claim 8, wherein the potentiometer is a digitally controlled potentiometer, and wherein the control level is determined from a digital control value supplied to the potentiometer.

10. A method of improving efficiency of an amplifier for providing an output signal to an audio transducer, the method comprising:
    receiving an indication of a magnitude of a signal to be amplified by the amplifier;
    selecting an operating mode of a power supply circuit according to the state of a control signal;

supplying a power supply voltage to the amplifier from the power supply circuit in conformity with the selected operating mode, wherein in a first operating mode of the power supply circuit, the power supply voltage is equal to a first voltage and in a second operating mode of the power supply circuit, the power supply voltage is substantially equal to a rational fraction of the first voltage.

setting the state of the control signal in conformity with the indication of magnitude, so that the control signal selects the first operating mode when the indication of magnitude indicates that clipping may occur in the output signal; and controlling a gain of the signal in conformity with the indication of magnitude for a predetermined period after the state of the control signal changes to select the first operating mode of the power supply circuit.

11. The method of claim 10, wherein in the second operating mode the power supply voltage is substantially equal to half of the first voltage.

12. The method of claim 10, wherein the power supply circuit has a unipolar power input having a ground terminal and an input voltage terminal, and wherein the power supply voltage is a bipolar output substantially symmetric about a voltage of the ground terminal.

13. The method of claim 10, wherein the power supply circuit is a charge pump power supply comprising a plurality of capacitors and a switching circuit for switching the capacitors alternatively from a series to a parallel combination, and wherein in response to the select input, a pattern of switching of the switching circuit is altered, whereby a rational relationship between the power supply voltage in the first operating mode and the power supply voltage in second operating mode is provided.

14. The method of claim 13, wherein the charge pump power supply includes a switched-capacitor voltage divider that uses a series-coupling of capacitors in a first switching phase of the second operating mode to produce the rational fraction of the first voltage and couples at least one of the capacitors to at least one of the power supply rail connections in a second switching phase of the second operating mode to apply the rational fraction of the first voltage to the at least one power supply rail connection.

15. The method of claim 10, further comprising a first amplifier stage circuit having an output coupled to the audio input of the power amplifier, wherein the first amplifier stage has a pair of first stage power supply rail connections connected to a fixed voltage power supply, wherein a fixed voltage of the fixed voltage power supply does not change substantially with selection of the operating mode of the power supply.

16. The method of claim 10, wherein the receiving receives a volume control level corresponding to a gain of a signal path of the signal and wherein the selecting is performed in conformity with a magnitude of the volume control level.

17. The method of claim 16, wherein the amplifier includes a potentiometer for controlling a magnitude of the output signal, and wherein the control circuit selects the magnitude in conformity with a control level of the potentiometer.

18. The method of claim 16, wherein the potentiometer is a digitally controlled potentiometer, and wherein the control level is determined from a digital control value supplied to the potentiometer.

19. The method of claim 10, wherein the receiving receives an indication of amplitude of the signal, and wherein the selecting is performed in conformity with the indication of magnitude.

20. An integrated circuit, comprising:
a power amplifier having an audio input for receiving an audio input signal, an audio output for providing an output signal, and a pair of power supply rail connections;
a power supply for providing a power supply voltage across the pair of power supply rail connections of the power amplifier, wherein the power supply has a select input for selecting an operating mode of the power supply, wherein in a first operating mode, the power supply voltage is equal to a first voltage, and wherein in a second operating mode the power supply voltage is substantially equal to a rational fraction of the first voltage, whereby power consumption of the power amplifier is reduced when a magnitude of the audio input signal is reduced;
a control circuit for controlling the select input of the power supply in conformity with an indication of the magnitude, so that the control circuit selects the first operating mode when the indication of magnitude indicates that clipping may occur in the output signal; and
a gain control circuit for controlling a magnitude of the audio input signal in conformity with the indication of the magnitude for a predetermined period after the control circuit selects the first operating mode of the power supply.

* * * * *